(12) United States Patent
Fackler et al.

(10) Patent No.: US 11,219,140 B2
(45) Date of Patent: Jan. 4, 2022

(54) FLEXIBLE HEAT PIPE COOLED ASSEMBLY

(71) Applicant: Andrew Wireless Systems GmbH, Buchdorf (DE)

(72) Inventors: Karl-Heinz Fackler, Wemding (DE); Rainer Friedrich, Maihingen (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

(21) Appl. No.: 16/586,119

(22) Filed: Sep. 27, 2019

(65) Prior Publication Data
US 2020/0113086 A1    Apr. 9, 2020

Related U.S. Application Data

(60) Provisional application No. 62/741,446, filed on Oct. 4, 2018.

(51) Int. Cl.
| | | |
|---|---|---|
| *H04B 1/03* | (2006.01) | |
| *H05K 7/20* | (2006.01) | |
| *F28D 15/02* | (2006.01) | |
| *H03F 3/20* | (2006.01) | |

(52) U.S. Cl.
CPC ..... *H05K 7/20681* (2013.01); *F28D 15/0275* (2013.01); *H03F 3/20* (2013.01); *H04B 1/03* (2013.01); *H05K 7/202* (2013.01); *H05K 7/2039* (2013.01); *H03F 2200/451* (2013.01)

(58) Field of Classification Search
CPC .. H05K 7/20681; H05K 7/202; H05K 7/2039; H05K 7/20336; H05K 7/20936;
(Continued)

(56) References Cited

U.S. PATENT DOCUMENTS

| | | | |
|---|---|---|---|
| 4,680,676 A | * | 7/1987 Petratos | ................. H05K 9/006 361/679.34 |
| 6,084,772 A | | 7/2000 Pell et al. | |
| | | (Continued) | |

FOREIGN PATENT DOCUMENTS

| | | |
|---|---|---|
| CN | 202697123 U | 1/2013 |
| EP | 1308073 B1 | 1/2012 |

OTHER PUBLICATIONS

International Searching Authority, "International Search Report and Written Opinion from PCT Application No. PCT/EP2019/076827", from Foreign Counterpart to U.S. Appl. No. 16/586,119, filed Jan. 28, 2020, pp. 1-13, Published: WO.

*Primary Examiner* — Mandeep S Buttar
(74) *Attorney, Agent, or Firm* — Fogg & Powers LLC

(57) ABSTRACT

In an example, a node of a telecommunications system includes a first section having one or more passive components; a second section including one or more power amplifier modules and a power supply, wherein the second section is coupled to the first section using fasteners; a distribution unit including a plate and a circuit board, wherein the second section is coupled to the distribution unit using fasteners; a cooling section; a first plurality of heat pipes extending from the one or more power amplifier modules to the cooling section; a second plurality of heat pipes extending from the first section into the second section; and a housing enclosing the first section and the second section.

28 Claims, 6 Drawing Sheets

(58) Field of Classification Search
CPC ............. H05K 7/20418; H05K 7/1492; H05K
2201/10371; F28D 15/0275; F28D 15/02;
F28D 15/04; F28D 15/00; H03F 3/20;
H03F 2200/451; H04B 1/03; H04B
1/036; H04B 1/38; H01L 23/427; H01L
23/4006; H01L 2023/4043; H01L
2023/405; H01L 33/64; G06F 1/20; G06F
1/189; G06F 1/181; G06F 1/183
USPC ....... 361/679.52, 700, 719, 697; 165/104.21,
165/104.33, 104.26, 80.2; 174/16.3;
257/E23.088, E23.084; 455/11.1, 349,
455/575.1
See application file for complete search history.

(56) References Cited

U.S. PATENT DOCUMENTS

| | | | |
|---|---|---|---|
| 10,381,739 B2* | 8/2019 | Keniuk | ................... H01Q 1/24 |
| 2003/0058613 A1* | 3/2003 | Varghese | ................ G06F 1/26 |
| | | | 361/679.01 |
| 2008/0054741 A1* | 3/2008 | Oyama | ............... F16C 32/0444 |
| | | | 310/68 A |
| 2010/0259339 A1* | 10/2010 | Corman | ................... G06G 7/12 |
| | | | 333/117 |
| 2014/0160679 A1* | 6/2014 | Kelty | ................... G02B 6/4269 |
| | | | 361/700 |
| 2016/0066314 A1* | 3/2016 | Notargiacomo | .. H04W 72/0433 |
| | | | 455/509 |

* cited by examiner

FLEXIBLE HEAT PIPE COOLED ASSEMBLY

CROSS-REFERENCE TO RELATED APPLICATIONS

This application claims the benefit of U.S. Provisional Application Ser. No. 62/741,446, filed Oct. 4, 2018, and titled "FLEXIBLE HEAT PIPE COOLED ASSEMBLY," which is hereby incorporated herein by reference.

BACKGROUND

Distributed antenna systems (DAS) are frequently used in confined areas to deploy wireless coverage and capacity to mobile devices. A remote unit of a DAS typically handles multiple technologies and frequency bands by using active and passive components in a single construction. The remote unit is coupled to one or more antennas and is also referred to as a remote antenna unit.

In previous designs for remote units of a DAS, the remote unit assembly included three block sections with inflexible design parameters. The first section, which is positioned at the bottom of the assembly when mounted, is used for passive components such as filters, combiners, and other components that have low power dissipation influence. To the extent that any cooling is necessary for these components in the first section, passive cooling has been utilized. On top of the first section, there is typically mounted a distribution unit to control distribution of DC power between the components and sections of the remote unit. The distribution unit also includes a bus network, RF signal control functionality, and DAS control functionality.

The second (middle) section of previous remote unit designs traditionally includes the high power dissipation components such as power amplifiers, optical receiver/transceivers, power supplies, and the like. To dissipate heat, the middle section includes heat pipes, which pass through a tight plate that seals the first and second sections from the environment when the cover is applied. The heat pipes end in the third section of the remote unit assembly. The third section is usually positioned on top of the remote unit and includes heat sinks, which are coupled to the heat pipes. The heat sinks and the top end of heat pipes are exposed to the environmental air so fans and/or the outside air cool down the heat sinks. The first and second sections are covered by a tube housing and sealed on both sides.

SUMMARY

In an aspect, a node of a telecommunications system includes a first section having one or more passive components. The node further includes a second section including one or more power amplifier modules and a power supply, wherein the second section is coupled to the first section using fasteners. The node further includes a distribution unit including a plate and a circuit board, wherein the second section is coupled to the distribution unit using fasteners. The node further includes a cooling section. The node further includes a first plurality of heat pipes extending from the one or more power amplifier modules to the cooling section. The node further includes a second plurality of heat pipes extending from the first section into the second section. The node further includes a housing enclosing the first section and the second section.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
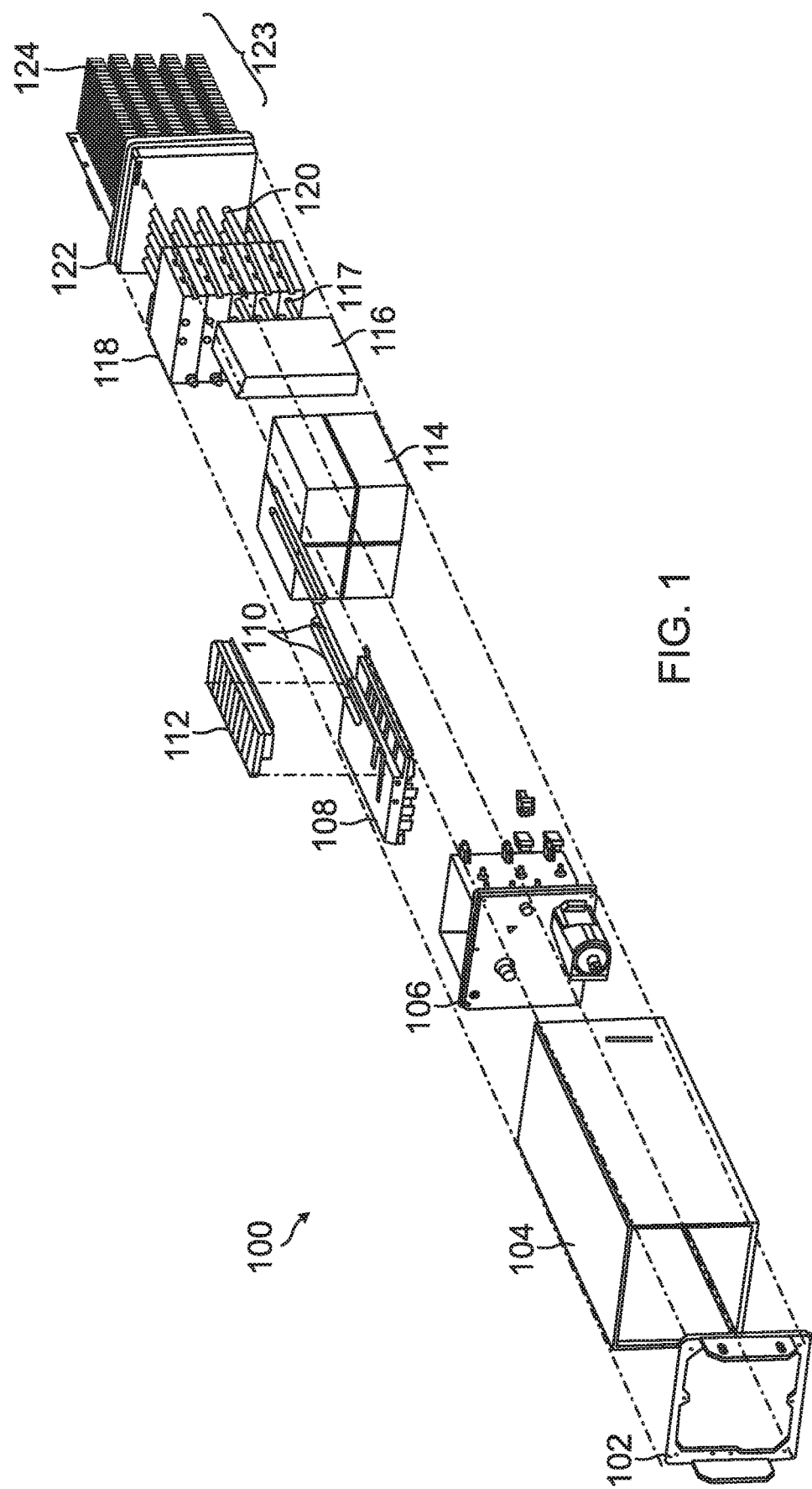
FIG. 1 is an exploded side perspective view of an example node of a telecommunications system according to an aspect of the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The past designs of remote units and other nodes of telecommunications systems are quite rigid and fail to meet particular needs for specific applications. In particular, there may be restrictions on dimensions (length, width, height) or weight for the node that cannot be met with rigid previous designs. Further, the assembly of the previous designs is limited to a single direction (starting with the first section) and configuration or components, which can be undesirable if there are different needs for specific applications.

Also, for next generation optical transceivers, front panel access is desired or required. For a remote unit, the front panel is generally located in a transverse plane axial to the extrusion direction of the housing of the remote unit. The output from the front panel, which can be analog or digital, is received by a signal processing board, which has a high range of heat dissipation that cannot be adequately cooled using the passive cooling of the past rigid design for the remote unit discussed above.

For the reasons stated above and for other reasons stated below which will become apparent to those skilled in the art upon reading and understanding the specification, there is a need in the art for a more flexible assembly for a node of a telecommunications system that can provide adequate cooling to all sections of the node.

In some aspects, the examples described herein include a flexible design for the node of a telecommunications system with more variability in the dimensions and features than previously achieved. For example, for a remote unit, the distribution unit that was previously fixed in between the first and second sections of previous designs of the remote unit assembly can now be positioned between the power amplifiers modules and the cooling section or elsewhere. With this modification, the arrangement of other components in the remote unit is not limited to the rigid block designs of the previous systems. In some aspects, the assembly of a node of a telecommunications system is also more flexible in that the design is not limited to starting assembly with the first section as discussed above. Further, in some aspects, examples of a node of a telecommunications system described herein include additional heat pipes to transfer heat away from the signal processing board or other components with a high range of heat dissipation positioned near the passive components of the node.

FIGS. 1-5 illustrate different views of an example node 100 of a telecommunications system according to an aspect of the present disclosure. For ease of illustration, the node 100 of a telecommunications system is depicted as a remote unit, such as, for example, a remote unit of a distributed antenna system. However, it should be understood that the description of the node included herewith is applicable to different nodes of a telecommunications system as well.

FIG. 1 illustrates an exploded view of the example node 100 of the telecommunications system. In the example shown in FIG. 1, the node 100 includes a frame 102, a housing 104, an antenna connection unit 106, signal processing board 108, first heat pipes 110, an active module 112, one or more optional passive modules 114, a power supply 116, second heat pipes 117, power amplifier modules 118, third heat pipes 120, a distribution unit 122, and a cooling section 123 having heat sinks 124. It should be understood that the particular components and configuration of the components of the node 100 can vary depending on requirements.

In some examples, the node 100 is a remote unit of a distributed antenna system (DAS) that is communicatively coupled to a master unit of the DAS and can be used for indoor or outdoor distribution of radio frequency signals. In some examples, the node 100 is a high-power remote unit. In other examples, the node 100 of the telecommunications system is a radio frequency repeater, a radio point of a small cell, an access point, or another type of node of a telecommunications system configured to distribute radio frequency signals within a coverage area.

In some examples, the housing 104 is an extruded rectangular tube. In some examples, the housing 104 is cut from a larger extrusion during manufacture, and the dimensions of the housing 104 are flexible. For example, if only two bands are need for a node 100, a smaller housing could be used compared to a node that requires more frequency bands. Further, street lights, signs, and other potential mounting locations for a node may require different dimensions. To accommodate the particular apparatus where the node is to be mounted, the dimensions (length, width, height) of the housing 104 can be adjusted as desired. In some examples, the housing 104 could also be elongated to integrate a notch filter or other larger size filters. This type of flexibility for dimensions of a node of a telecommunications system was not available with the rigid design described above.

The frame 102 is made of metal or other suitable rigid material. The frame 102 is attached to the antenna connection unit 106 using fasteners (for example screws, rivets, or the like). The frame 102 is fixed along the perimeter of the end of the housing 104. In some examples, one or more seals are placed between the frame 102 and the antenna connection unit 106, so the components of the node 100 are protected from dust and other contaminants in the environment surrounding the node 100.

In some examples, the antenna connection unit 106 includes the front panel for the node, which includes ports or connectors to couple the node 100 to other devices. For example, the front panel can include an antenna connector to couple the node to an antenna, a mains power connector, an optical connector to couple the node to another component of the telecommunications system, etc. In some examples, the antenna connection unit 106 includes a combiner configured to combine signals having a plurality of frequencies for output from an antenna attached to the antenna connection unit 106. In some examples, the antenna connection unit 106 is configured for phase combining or cross-combining the frequencies for the node 100.

The node 100 includes a power supply 116, which is positioned to the side of the power amplifier modules 118. The power supply 116 is configured to convert mains power to the particular voltages needed for the power amplifier modules 118 of the node 100. In some examples, the mains power can be provided to the node 100 via a connection at the front panel.

In some examples, the node 100 transmits uplink signals to a different component of the telecommunications system using an optical transceiver module. For example, a remote unit of a DAS transmits uplink signals to master unit of the DAS and receives downlink signals from a master unit of the DAS using an optical transceiver module, which is accessed from the front panel of the remote unit. The output of the optical transceiver module is a digital signal. In some examples, the optical transceiver module is an enhanced small form-factor pluggable (SFP+) transceiver. In some examples, the node 100 includes a signal processing board 108 that hosts the optical transceiver module and converts the output signal from the signal processing board 108 for further use by other components of the node 100.

In some examples, the node 100 includes an active module 112 that is coupled to the signal processing board 108 that hosts the optical transceiver module. The active module 112 is configured to receive the output from the signal processing board 108. In some examples, the active module 112 includes one or more preamplifiers, gain blocks, or other features for conditioning the signals prior to amplification by the high power amplifiers 118.

The node 100 further includes one or more power amplifier modules 118 for amplifying the RF signals for transmission. In some examples, the one or more power amplifier modules 118 comprise a plurality of high-power amplifiers mounted to bases that are stacked perpendicularly to the longitudinal axis of the node 100. In some examples, each power amplifier module 118 includes a respective base. In some examples, respective power amplifiers are mounted to opposing sides of a common base.

In some examples, the node 100 includes one or more passive modules 114 between the antenna connection unit 106 and the power amplifier modules 118. In some examples, the one or more passive modules 114 are included for filtering the signals prior to amplification at the power amplifiers of the one or more power amplifier modules 118. In some examples, the one or more passive modules 114 are included for filtering the signals output from the power amplifier modules 118. In such examples, the filtered signals are provided from the one or more passive modules 114 to the antenna connection unit 106 where the signals are combined. In some examples, the one or more passive modules 114 form a duplexer for uplink/downlink filtering.

The node 100 includes a distribution unit 122, which includes a plate and circuit board. In some examples, the plate is a tight plate similar to that described above. The circuit board of the distribution unit 122 is used to distribute DC power and implement DAS control functionality. The distribution unit 122 does not implement RF control functionality. In the example shown in FIGS. 1-4, the distribution unit 122 is an interface between other components of the node 100 and the cooling section 123. However, the distribution unit 122 can be positioned in a different location in the assembly.

The power supply 116 and the power amplifier modules 118 can produce a high amount of heat such that the heat must be dissipated from these components. In some examples, the node 100 includes heat pipes 117 that extend from the power supply 116 to a cooling section 123 of the node 100. In some examples, the node 100 includes heat pipes 120 that extend from the power amplifier modules 118 to the cooling section 123. In some examples, the heat pipes 117, 120 include water as the medium filled inside the heat pipes 117, 120. However, other mediums filled inside the heat pipe could also be used. For example, an alcohol or refrigerant could be filled inside the heat pipe instead of water. The diameter of the heat pipes 117, 120 and the medium inside the heat pipes 117, 120 can be selected based on the desired thermal properties for a particular application. In some examples, the characteristics of the heat pipes 117 are similar to the characteristics of the heat pipes 120.

Figure 2:
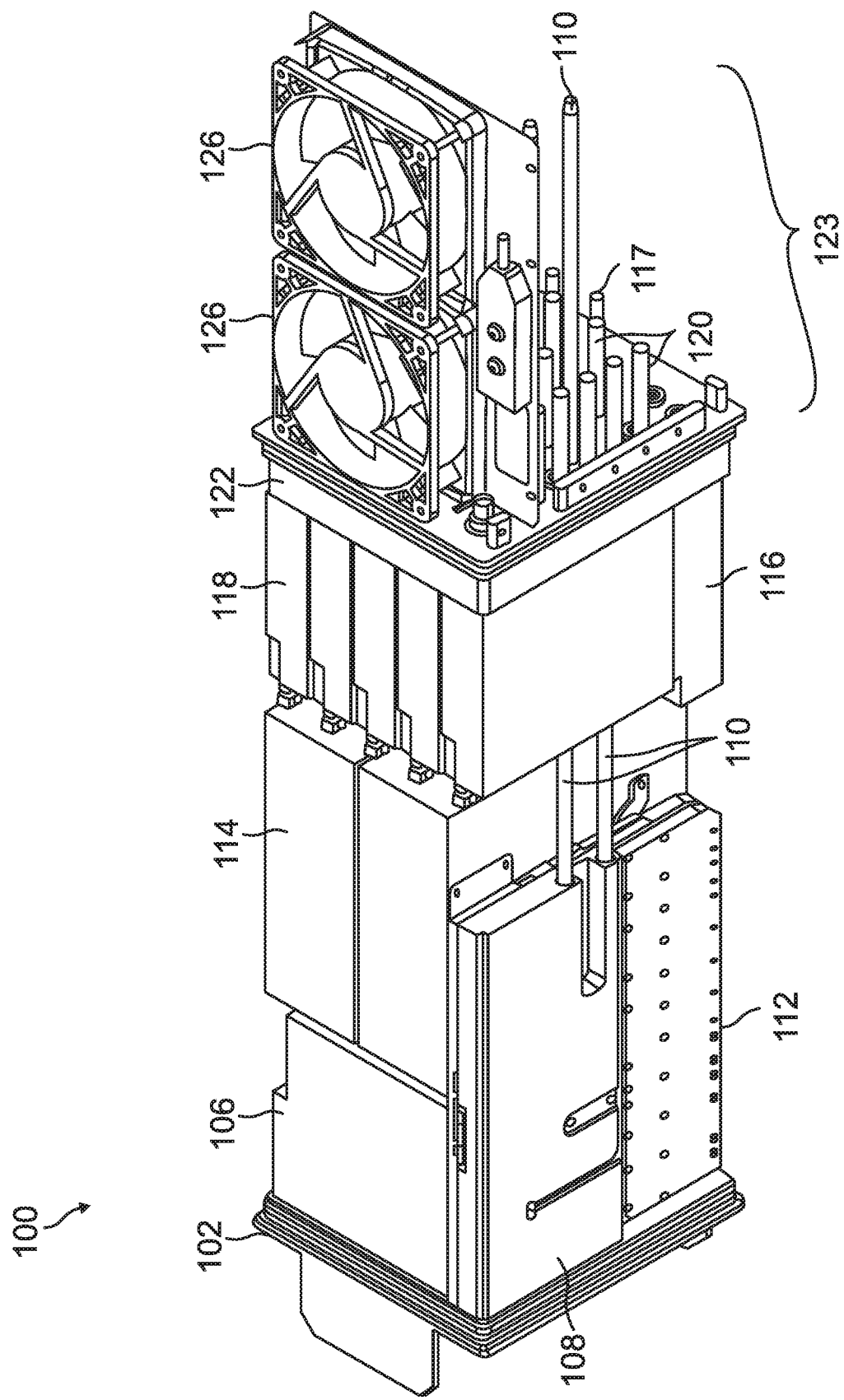
FIG. 2 is a side perspective view of an example node of a telecommunications system according to an aspect of the present disclosure.
Figure 3:
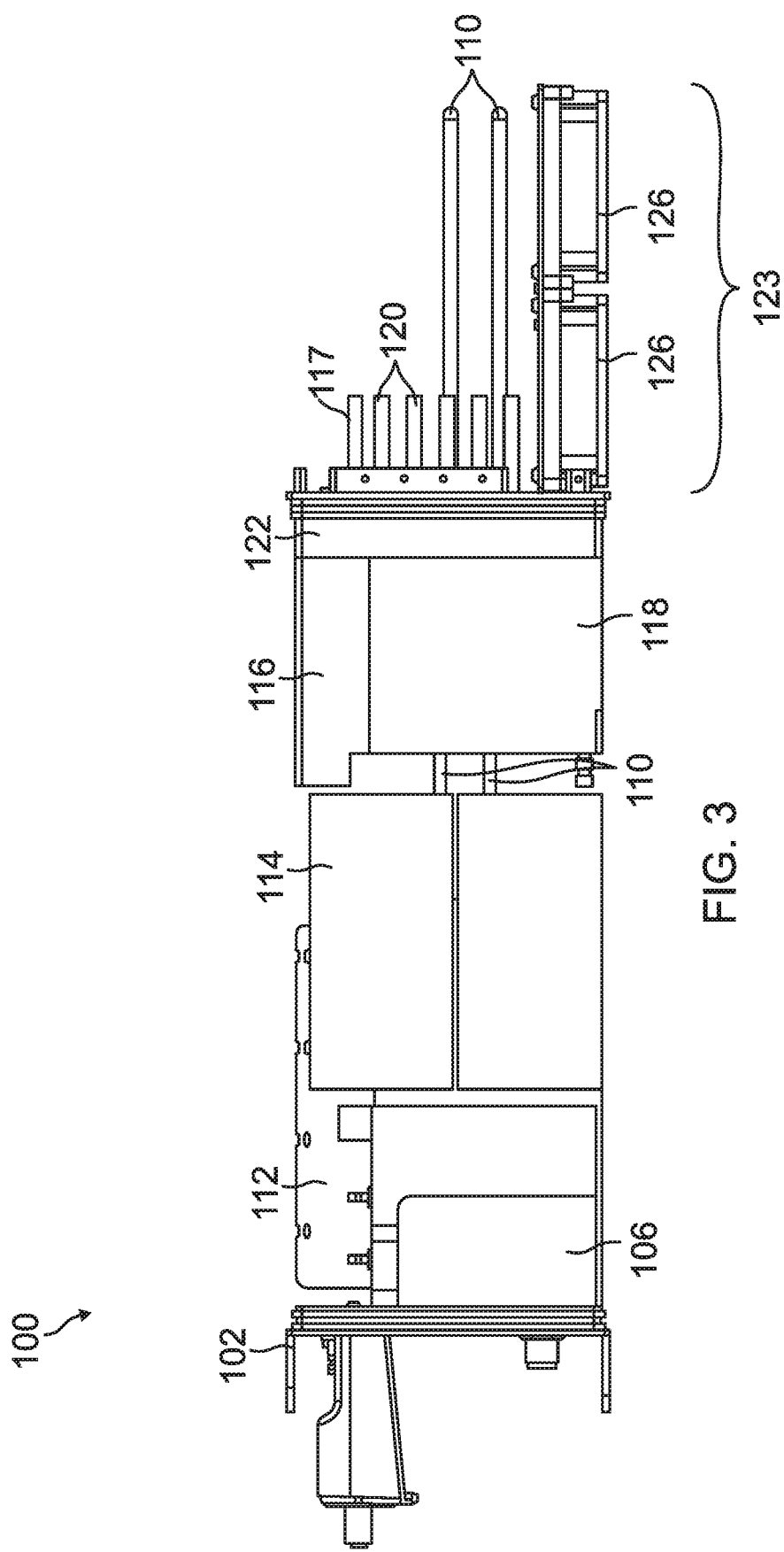
FIG. 3 is a side view of an example node of a telecommunications system according to an aspect of the present disclosure.
Figure 4:
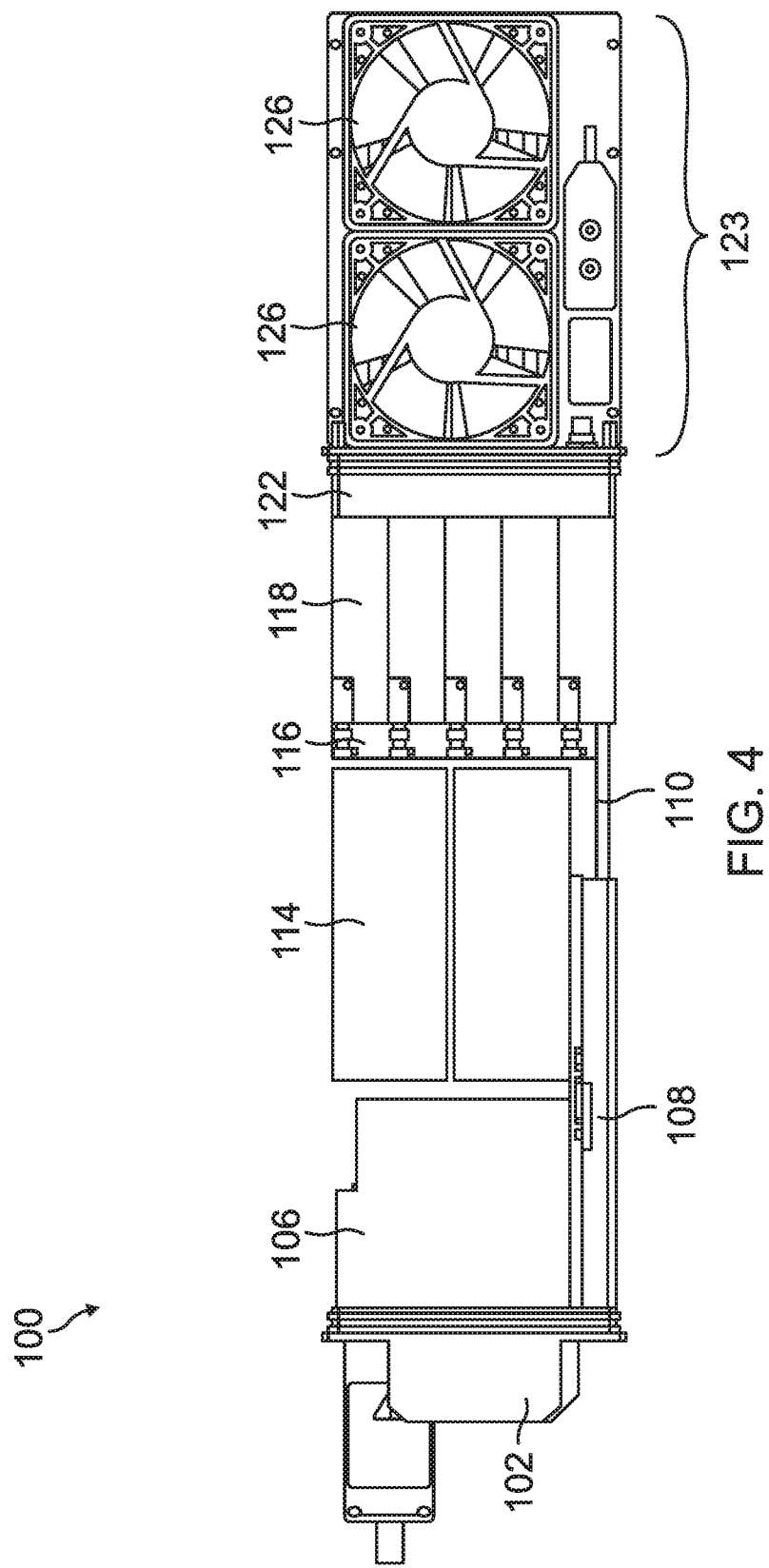
FIG. 4 is an alternative side view of an example node of a telecommunications system according to an aspect of the present disclosure.

In the example shown in FIG. 1, the cooling section 123 includes a plurality of heat sinks 124. The heat pipes 117 and heat pipes 120 extend through the plate and circuit board of the distribution unit 122 to the cooling section 123. In some examples, the cooling section 123 of the node containing the heat sinks 124 optionally includes one or more fans 126. FIGS. 2-4 illustrates different views of the example node 100 that includes fans 126. In the examples shown in FIGS. 2-4, the heat sinks 124 are not included for ease of viewing the heat pipes 117, 120, 110 that extend through the plate and circuit board of the distribution unit 122.

Figure 5:
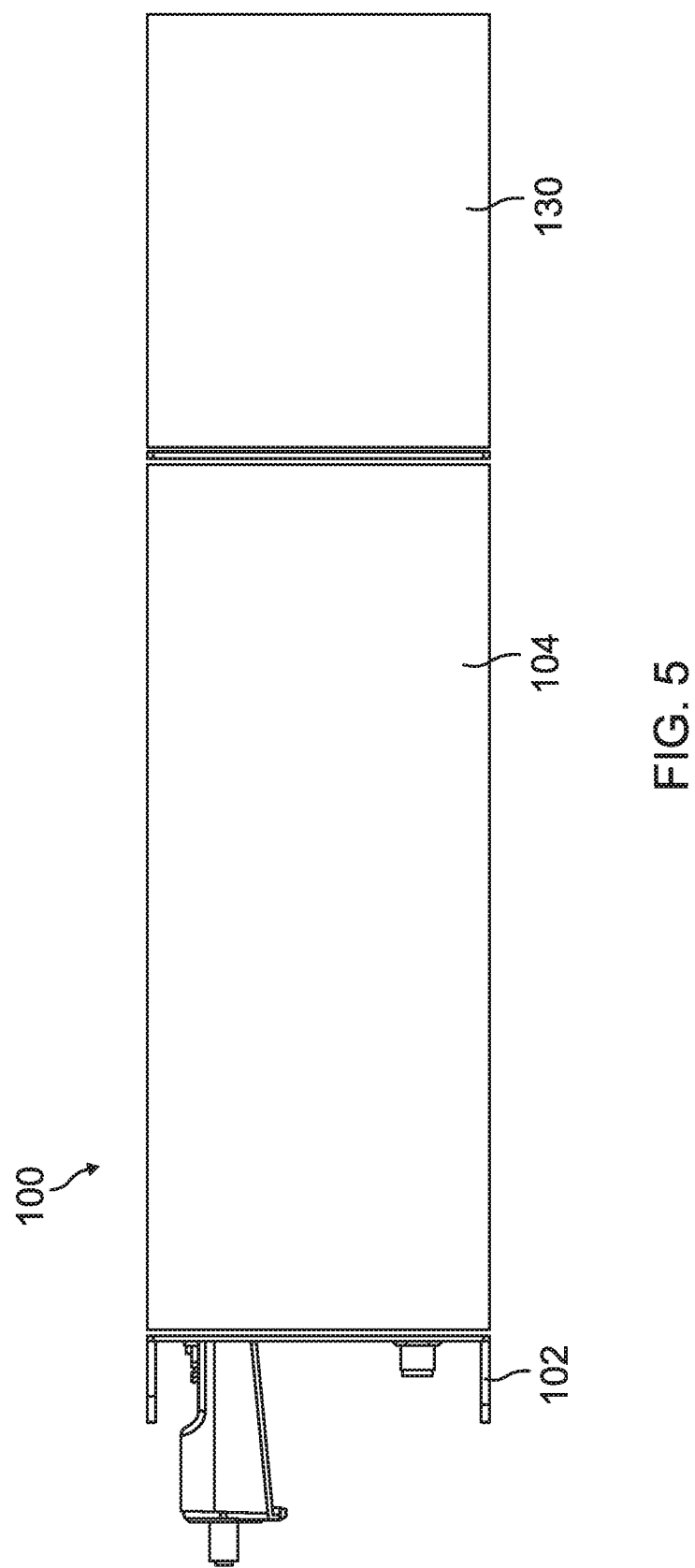
FIG. 5 is a side view of an example node of a telecommunications system according to an aspect of the present disclosure.

FIG. 5 illustrates an example assembled node 100 of a telecommunications system. In the example shown in FIG. 5, the cooling section 123 of the node 100 is enclosed with a separate housing 130 that provides protection for the components of the cooling section 123. In some examples, the housing 130 includes vents (not shown) in one side to facilitate the transfer of heat from the cooling section 123 to the outside environment. In examples where the cooling section 123 includes one or more fans 126, the housing 130 includes one or more holes to accommodate the fans 126. In some examples, the holes for accommodating the fans 126 are positioned on the side opposite of a vent. In such examples, the fans 126 can be configured to draw in ambient air and blow the air across heat sinks such that warm air is forced out the vent on the other side.

While a separate housing 130 is shown in FIG. 5, it should be understood that the housing 104 can also be elongated to cover the cooling section as well in some examples. In such examples, the housing 104 can include a vent and/or holes to accommodate fans 126 to facilitate heat transfer from the cooling section 123 to the environment. Further, it should be understood that a housing for the cooling section 123 is optional in some environments (for example, indoors) and the cooling section may include uncovered heat sinks 124 and/or fans similar to the examples shown in FIGS. 1-4.

In some examples, the signal processing board 108 hosting the optical transceiver module or other components near the antenna connection unit 106 also produce a high amount of heat such that the heat must be dissipated. To adequately dissipate the heat, the example node 100 in FIGS. 1-4 advantageously includes heat pipes 110 that extend away from the signal processing board 108 or other components in the first section to dissipate heat from the first section of the node. In some examples, a cooling transmission plate (not shown) is attached to the signal processing board 108, which includes one or more heat pipes 110. In some examples, the heat pipes 110 are connected or driven through tunnels or channels through the one or more passive modules 114, the one or more power amplifier modules 118, and/or other components of the node 100. In some examples, the tunnels or channels are insulated to avoid thermal influence or to assure different temperature levels in the respective sections of the node. For example, the tunnels or channels can be insulated using air gaps or a material having low thermal conductivity. In some examples, the heat pipes 110 extend through the second section of the node 100 without tunneling through other components.

In the example shown in FIGS. 1-4, the heat pipes 110 will be longer than the heat pipes 117, 120 since the signal processing board 108 is coupled to the antenna connection unit 106 on the opposite side of the one or more power amplifier modules 118 from the cooling section. In some examples, the other parameters (besides length) of the heat pipes 110 (diameter, medium inside, etc.) are the same as for the heat pipes 117 coupled to the power supply 116 and the heat pipes 120 coupled to the power amplifier modules 118. In other examples, the other parameters of the heat pipes 110 are different than those used for the heat pipes 117 coupled to the power supply 116 and/or the heat pipes 120 coupled to the power amplifier modules 118.

In some examples, the heat pipes 110 include water as the medium filled inside the heat pipes 110. However, other mediums filled inside the heat pipe could also be used. In some examples, alcohol, refrigerants, or another medium filled inside the heat pipe can be used instead of water. The length and particular configuration of the heat pipes 110 is flexible and can be determined for the particular needs of application. For example, the heat pipes 110 can include curves to form to the particular components and/or tunnels that the heat pipes 110 pass through.

It should also be understood that the particular functionality of the heat pipes 110 can be the same or different from the functionality of the heat pipes 117 coupled to the power supply 116 and the heat pipes 120 coupled to the power amplifier modules 118. For example, rather than the heat pipes 110 extending through the second section to the cooling section 123, the heat pipes 110 can be used to distribute heat to the passive components of the node 100 (for example, the one or more passive modules 114). In practice, the passive components of the node 100 have a different operating temperature ranges compared to the active components, especially compared to the one or more power amplifier modules 118. The passive components are generally lower rated for temperature, and the minimum operating temperature of the passive components is around 0° C. The active components (power amplifiers) are higher rated for temperature and can operate down to −40° C. In some circumstances, the passive components (for example, filters) may have to be heated. In some examples, the node 100 is configured to distribute heat from the signal processing board 108 to the passive components via the heat pipes 110.

Figure 6:
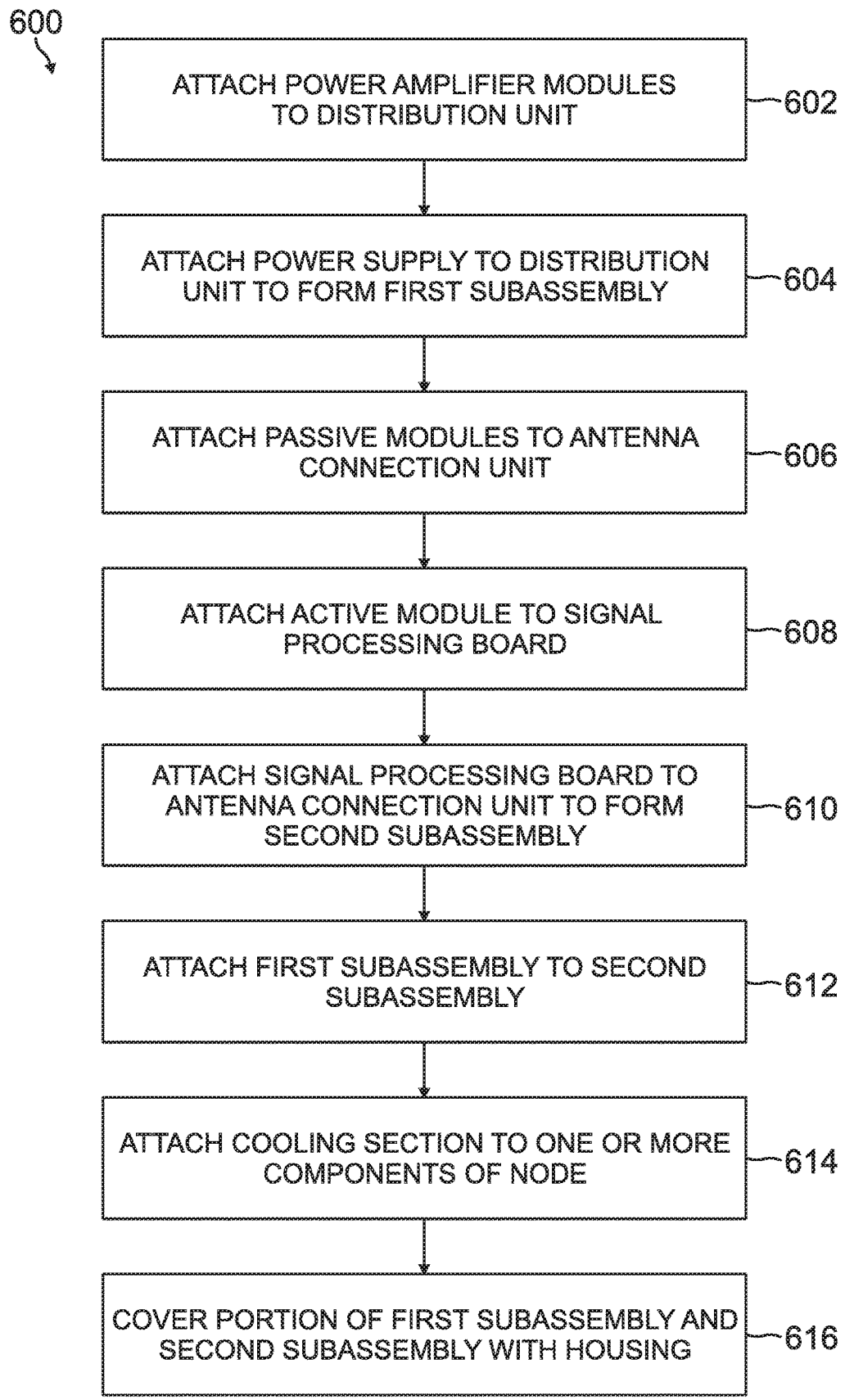
FIG. 6 is flow diagram of an example method of assembling the node of a telecommunications system according to an aspect of the present disclosure.

FIG. 6 is flow diagram of an example method 600 of assembling a node of a telecommunications system according to an aspect of the present disclosure. The common features discussed above with respect to node 100 in FIGS. 1-5 can include similar characteristics to those discussed with respect to method 600 and vice versa.

While the method 600 of assembling the node of the telecommunications system is discussed in a particular order, it should be understood that the method 600 is not limited to the particular order shown in FIG. 6 or described below. In particular, since the node of a telecommunications system discussed herein includes flexible modules rather than predefined blocks, the node can be assembled in a number of different ways. Further, in some examples, one or more blocks for method 600 can be omitted.

The method 600 includes attaching one or more power amplifier modules to a distribution unit (block 602). In some examples, the distribution unit includes a plate and a circuit board configured to distribute DC power and perform DAS control functionality. In some examples, the plate and circuit board have a plurality of through holes to accommodate a plurality of heat pipes from various components of the node. In some examples, the one or more power amplifier modules are attached to the plate of the distribution unit using one or more fasteners (for example, screws). The power amplifier modules can include tunnels that receive heat pipes for dissipating heat. In some examples, attaching the one or more power amplifier modules to the plate includes extending one or more heat pipes from the one or more power amplifier modules through the plate and circuit board to the cooling section. In some examples, the through holes in the plate and circuit board are sealed surrounding the heat pipes.

The method 600 further includes attaching the power supply to the distribution unit (block 604). In some examples, the power supply is attached to the plate of the distribution unit using one or more fasteners (for example, screws). In some examples, attaching the power supply to the plate includes extending one or more heat pipes from the one or more power amplifier modules through the plate and circuit board of the distribution unit to the cooling section. In some examples, the through holes in the plate and circuit board are sealed surrounding the heat pipes. The cooling section, distribution unit, one or more power amplifier modules, and the power supply form a first subassembly of the node.

The method 600 optionally includes attaching one or more passive modules to the antenna connection unit (block 606). In some examples, the one or more passive filter modules are attached to the antenna connection unit using one or more fasteners (for example, screws).

In some examples, the method 600 includes attaching an active module to a signal processing board (block 608). In some examples, the active module is mounted to the signal processing board. The active module can be soldered or otherwise attached using methods known to those having skill in the art. In some examples, the active module includes one or more preamplifiers, gain blocks, or other features for conditioning the signals prior to amplification by the high power amplifiers.

In some examples, the method 600 further includes attaching the signal processing board to an antenna connection unit (block 610). In some examples, the signal processing board is attached to the antenna connection unit using one or more fasteners (for example, screws). In some examples, the signal processing board is coupled to the front panel of the node such that an optical transceiver module on the signal processing board can be accessed through the front panel of the node.

The antenna connection unit, signal processing board, and active module form a second subassembly of the node. In some examples, the one or more passive filter modules are also included in the second subassembly.

The method 600 further includes attaching the first subassembly to the second subassembly (block 612). In some examples, components of the first subassembly and the second subassembly are attached using one or more connection elements and fasteners (for example, screws). The one or more connection elements can be plates have a plurality of through holes positioned to correspond to respective holes in the components of the first subassembly and the second subassembly. In some examples, one or more components of the first subassembly are attached to a frame element and one or more components of the second subassembly are attached to a respective frame element. In such examples, attaching the first subassembly to the second subassembly includes attaching the respective frame elements together using the one or more connection elements and fasteners.

In some examples, attaching the first subassembly to the second subassembly includes extending heat pipes from the second subassembly to the first subassembly. For example, heat pipes positioned in channels in the signal processing board or a cooling plate coupled to the signal processing board are extended through the power amplifier modules of the first subassembly. In some examples, the power amplifier modules include tunnels to receive the heat pipes extending from the second subassembly. In some examples, the heat pipes extending from the second subassembly extend through the tunnels in the power amplifier modules and the distribution unit to transfer heat from the second assembly to the cooling section.

The method 600 further includes attaching a cooling section to one or more components of the node (block 614). In some examples, the cooling section includes at least one heat sink and/or at least one fan. The cooling section can include a frame or other structure for positioning or stabilizing the components of the cooling section. In some examples, the cooling section is attached to the distribution unit. In some examples, the cooling section is attached to the plate using one or more fasteners (for example, screws).

The method 600 includes covering at least a portion of the first subassembly and the second subassembly with a housing (block 616). In some examples, the housing has a rectangular tube shape that covers the components of the node except the cooling section. The dimensions of the housing are flexible and can be modified to accommodate the desired components and configuration of the node. In some examples, one or more seals are positioned between the edges of one end of the housing and the distribution unit and one or more seals are positioned between the edges of the opposite end of the housing and a frame of the node. In some examples, a single housing covers all components of the node including the cooling section. In some examples, brackets are also attached to the housing for the node to be mounted to a street light, pole, or other structure.

The examples described herein provide a flexible design for the node of a telecommunications system with more variability in the dimensions and features than previously achieved. The arrangement of components in the node is not limited to the rigid block designs of previous systems, and the assembly of the node is more flexible in that the node can be assembled in a number of different ways. Further, examples of the node described herein include additional heat pipes to transfer heat away from the signal processing board or other high power dissipation components positioned near passive components of the node.

Again, while the particular figures show a remote unit, the beneficial features can be used for other nodes that distributed radio frequency signals to a coverage area. For example, similar designs can be implemented in a radio frequency repeater, radio point for a small cell, an access point, or other nodes of a telecommunications system.

In various aspects, system elements described throughout this disclosure (such as the node of the telecommunications system and components thereof, for example) may be implemented on one or more computer systems, field programmable gate array (FPGA), application specific integrated circuit (ASIC) or similar devices comprising hardware executing code to realize those elements, processes, or examples, said code stored on a non-transient data storage device. These devices include or function with software programs, firmware, or other computer readable instructions for carrying out various methods, process tasks, calculations, and control functions, used in a distributed antenna system.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Example Embodiments

Example 1 includes a node of a telecommunications system, comprising: a first section including one or more passive components and a signal processing board; a second section including one or more power amplifier modules and a power supply, wherein the second section is coupled to the first section using fasteners; a distribution unit including a plate and a circuit board, wherein the second section is coupled to the distribution unit using fasteners; a cooling section; a first plurality of heat pipes extending from the one or more power amplifier modules to the cooling section; a second plurality of heat pipes extending from the first section into the second section; and a housing enclosing the first section and the second section.

Example 2 includes the node of Example 1, wherein the first section comprises an antenna connection unit including one or more combiners.

Example 3 includes the node of any of Examples 1-2, further comprising one or more passive filter modules positioned between the first section and the second section, wherein the one or more passive filter modules are configured to passively filter uplink signals from the one or more power amplifier modules and/or passively filter downlink signals prior to amplification by the one or more power amplifier modules.

Example 4 includes the node of any of Examples 1-3, wherein the first section includes a signal processing board, wherein the second plurality of heat pipes extend from the first section through the second section, where the second plurality of heat pipes are configured to transfer heat away from the signal processing board.

Example 5 includes the node of any of Examples 1-4, wherein the second plurality of heat pipes extend through one or more channels or tunnels in one or more passive filter modules, wherein the one or more passive filter modules are positioned between the first section and the second section.

Example 6 includes the node of Example 5, further comprising an active module mounted to the signal processing board, wherein the active module comprises one or more preamplifiers and/or gain blocks.

Example 7 includes node of any of Examples 1-6, wherein the second plurality of heat pipes extend through the second section to the cooling section.

Example 8 includes the node of Example 7, wherein the second plurality of heat pipes extend through one or more channels or tunnels in the one or more power amplifier modules.

Example 9 includes the node of Example 8, wherein the one or more channels or tunnels are insulated.

Example 10 includes the node of any of Examples 7-9, wherein the cooling section is coupled to the distribution unit, wherein the second plurality of heat pipes extend through the plate and circuit board of the distribution unit to the cooling section.

Example 11 includes the node of any of Examples 1-10, wherein the cooling section comprises at least one fan and/or at least one heat sink.

Example 12 includes the node of Example 11, wherein the cooling section is enclosed with a cover, wherein the cover includes a vent.

Example 13 includes the node of any of Examples 1-12, wherein the node comprises a remote unit of a distributed antenna system.

Example 14 includes the node of Example 13, wherein the first section includes a signal processing board having an optical transceiver module configured to be coupled to a master unit of the distributed antenna using an optical fiber cable, wherein the optical transceiver module is configured to convert a received optical signal and output a digital signal.

Example 15 includes node of any of Examples 1-14, wherein the node comprises a radio frequency repeater or a radio point of a small cell.

Example 16 method of assembling a node of a telecommunications system, the method comprising: attaching one or more power amplifier modules to a distribution unit, wherein the distribution unit comprises a plate coupled to a circuit board; attaching a power supply to the distribution unit, wherein the distribution unit, the one or more power amplifier modules, and the power supply form a first subassembly; attaching the signal processing board to an antenna connection unit, wherein the signal processing board and the antenna connection unit form a second subassembly; attaching the first subassembly to the second subassembly; and attaching a cooling section to one or more components of the node of the telecommunications system, wherein the cooling section includes at least one heat sink.

Example 17 includes the method of Example 16, further comprising covering at least a portion of the first subassembly and the second subassembly with a housing.

Example 18 includes the method of Example 17, wherein the at least a portion of the first subassembly includes the distribution unit, the one or more power amplifier modules, and the power supply; the method further comprising sealing the housing.

Example 19 includes the method of any of Examples 16-18, further comprising attaching an active module to a signal processing board.

Example 20 includes the method of any of Examples 16-19, wherein attaching the one or more power amplifier modules to the distribution unit comprises extending a first plurality of heat pipes through a plurality of through-holes in the distribution unit, wherein the plurality of heat pipes are partially positioned within the one or more power amplifier modules, wherein the plurality of heat pipes are configured to transfer heat from the one or more power amplifier modules to the cooling section.

Example 21 includes the method of Example 20, wherein attaching the first subassembly to the second subassembly comprises extending a second plurality of heat pipes from the second assembly to the first assembly.

Example 22 includes the method of Example 21, wherein extending the second plurality of heat pipes from the second assembly to the first assembly includes coupling the second plurality of heat pipes from tunnels in a component of the second subassembly to tunnels in the one or more power amplifier modules.

Example 23 includes the method of any of Examples 16-22, further comprising attaching one or more passive modules to the antenna connection unit, wherein the first subassembly further comprises the one or more passive modules.

Example 24 includes the method of any of Examples 16-23, wherein attaching the first subassembly to the second subassembly comprises extending a second plurality of heat pipes from the second assembly through the first subassembly to the cooling section.

Example 25 includes the method of Example 24, wherein extending the second plurality of heat pipes from the second subassembly through the first subassembly to the cooling section comprises extending the second plurality of heat pipes through the distribution unit.

Example 26 includes the method of any of Examples 24-25, wherein extending the second plurality of heat pipes from the second subassembly through the first subassembly to the cooling section comprises extending the second plurality of heat pipes through a power amplifier module.

Example 27 includes the method of any of Examples 16-26, wherein attaching the first subassembly to the second subassembly comprises extending a second plurality of heat pipes from tunnels in a component of the second subassembly to an area within the first subassembly.

Example 28 includes the method of any of Examples 16-27, wherein attaching the first subassembly to the second subassembly comprises extending a second plurality of heat pipes from tunnels in a component of the second subassembly through the first subassembly without extending the second plurality of heat pipes through another component.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A node of a telecommunications system, comprising:
a first section including one or more passive components and a signal processing board, wherein the signal processing board includes one or more components configured to transmit signals to or receive signals from one or more devices separate from the node;
a second section including one or more power amplifier modules and a power supply, wherein the second section is coupled to the first section using fasteners;
a distribution unit including a plate and a circuit board configured to distribute direct current (DC) power, wherein the second section is coupled to the distribution unit using fasteners;
a cooling section;
a first plurality of heat pipes extending from the one or more power amplifier modules to the cooling section;
a second plurality of heat pipes extending from the first section into the second section; and
a housing enclosing the first section and the second section.

2. The node of claim 1, wherein the first section comprises an antenna connection unit including one or more combiners.

3. The node of claim 1, further comprising one or more passive filter modules positioned between the first section and the second section, wherein the one or more passive filter modules are configured to passively filter uplink signals from the one or more power amplifier modules and/or passively filter downlink signals prior to amplification by the one or more power amplifier modules.

4. The node of claim 1, wherein the second plurality of heat pipes extend from the first section through the second section, where the second plurality of heat pipes are configured to transfer heat away from the signal processing board.

5. The node of claim 1, wherein the second plurality of heat pipes extend through one or more channels or tunnels in one or more passive filter modules, wherein the one or more passive filter modules are positioned between the first section and the second section.

6. The node of claim 5, further comprising an active module mounted to the signal processing board, wherein the active module comprises one or more preamplifiers and/or gain blocks.

7. The node of claim 1, wherein the second plurality of heat pipes extend through the second section to the cooling section.

8. The node of claim 7, wherein the second plurality of heat pipes extend through one or more channels or tunnels in the one or more power amplifier modules.

9. The node of claim 8, wherein the one or more channels or tunnels are insulated.

10. The node of claim 7, wherein the cooling section is coupled to the distribution unit, wherein the second plurality of heat pipes extend through the plate and circuit board of the distribution unit to the cooling section.

11. The node of claim 1, wherein the cooling section comprises at least one fan and/or at least one heat sink.

12. The node of claim 11, wherein the cooling section is enclosed with a cover, wherein the cover includes a vent.

13. The node of claim 1, wherein the node comprises a remote unit of a distributed antenna system.

14. The node of claim 13, wherein the first section includes a signal processing board having an optical transceiver module configured to be coupled to a master unit of the distributed antenna system using an optical fiber cable, wherein the optical transceiver module is configured to convert a received optical signal and output a digital signal.

15. The node of claim 1, wherein the node comprises a radio frequency repeater or a radio point of a small cell.

16. A method of assembling a node of a telecommunications system, the method comprising:
   attaching one or more power amplifier modules to a distribution unit, wherein the distribution unit comprises a plate coupled to a circuit board, wherein the circuit board is configured to distribute direct current (DC) power;
   attaching a power supply to the distribution unit, wherein the distribution unit, the one or more power amplifier modules, and the power supply form a first subassembly;
   attaching a signal processing board to an antenna connection unit, wherein the signal processing board includes one or more components configured to transmit signals to or receive signals from one or more devices separate from the node, wherein the signal processing board and the antenna connection unit form a second subassembly;
   attaching the first subassembly to the second subassembly; and
   attaching a cooling section to one or more components of the node of the telecommunications system, wherein the cooling section includes at least one heat sink.

17. The method of claim 16, further comprising covering at least a portion of the first subassembly and the second subassembly with a housing.

18. The method of claim 17, wherein the at least a portion of the first subassembly includes the distribution unit, the one or more power amplifier modules, and the power supply; the method further comprising sealing the housing.

19. The method of claim 16, further comprising attaching an active module to a signal processing board.

20. The method of claim 16, wherein attaching the one or more power amplifier modules to the distribution unit comprises extending a first plurality of heat pipes through a plurality of through-holes in the distribution unit, wherein the first plurality of heat pipes are partially positioned within the one or more power amplifier modules, wherein the first plurality of heat pipes are configured to transfer heat from the one or more power amplifier modules to the cooling section.

21. The method of claim 20, wherein attaching the first subassembly to the second subassembly comprises extending a second plurality of heat pipes from the second subassembly to the first subassembly.

22. The method of claim 21, wherein extending the second plurality of heat pipes from the second subassembly to the first subassembly includes coupling the second plurality of heat pipes from tunnels in a component of the second subassembly to tunnels in the one or more power amplifier modules.

23. The method of claim 16, further comprising attaching one or more passive modules to the antenna connection unit, wherein the first subassembly further comprises the one or more passive modules.

24. The method of claim 16, wherein attaching the first subassembly to the second subassembly comprises extending a second plurality of heat pipes from the second subassembly through the first subassembly to the cooling section.

25. The method of claim 24, wherein extending the second plurality of heat pipes from the second subassembly through the first subassembly to the cooling section comprises extending the second plurality of heat pipes through the distribution unit.

26. The method of claim 24, wherein extending the second plurality of heat pipes from the second subassembly through the first subassembly to the cooling section comprises extending the second plurality of heat pipes through a power amplifier module.

27. The method of claim 16, wherein attaching the first subassembly to the second subassembly comprises extending a second plurality of heat pipes from tunnels in a component of the second subassembly to an area within the first subassembly.

28. The method of claim 16, wherein attaching the first subassembly to the second subassembly comprises extending a second plurality of heat pipes from tunnels in a component of the second subassembly through the first subassembly without extending the second plurality of heat pipes through another component.

* * * * *